(12) United States Patent
Gambino et al.

(10) Patent No.: US 11,075,148 B2
(45) Date of Patent: Jul. 27, 2021

(54) STACKED TRANSISTOR ASSEMBLY WITH DUAL MIDDLE MOUNTING CLIPS

(71) Applicant: SEMICONDUCTOR COMPONENTS INDUSTRIES, LLC, Phoenix, AZ (US)

(72) Inventors: Jeffrey Peter Gambino, Gresham, OR (US); David T. Price, Gresham, OR (US); Jeffery A. Neuls, Beaverton, OR (US); Dean E. Probst, West Jordan, UT (US); Santosh Menon, Portland, OR (US); Peter A. Burke, Portland, OR (US); Bigildis Dosdos, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/675,525

(22) Filed: Nov. 6, 2019

(65) Prior Publication Data

US 2021/0111106 A1    Apr. 15, 2021

Related U.S. Application Data

(60) Provisional application No. 62/912,926, filed on Oct. 9, 2019.

(51) Int. Cl.
*H01L 23/00* (2006.01)
*H01L 23/495* (2006.01)
(Continued)

(52) U.S. Cl.
CPC .. *H01L 23/49575* (2013.01); *H01L 23/49517* (2013.01); *H01L 23/49562* (2013.01);
(Continued)

(58) Field of Classification Search
CPC ......... H01L 23/49575; H01L 23/49517; H01L 23/49562; H01L 24/08; H01L 24/37;
(Continued)

(56) References Cited

U.S. PATENT DOCUMENTS

| 7,271,470 | B1 * | 9/2007 | Otremba | H01L 23/492 |
| | | | | 257/666 |
| 7,271,477 | B2 * | 9/2007 | Saito | H01L 23/49575 |
| | | | | 257/686 |
| 8,450,845 | B2 * | 5/2013 | Ikeda | H01L 24/83 |
| | | | | 257/712 |

OTHER PUBLICATIONS

K. Vladimirova et al., "Solderless Leadframe Assisted Wafer-Level Packaging Technology for Power Electronics," ECTC 2018.
(Continued)

*Primary Examiner* — Nikolay K Yushin
(74) *Attorney, Agent, or Firm* — Brake Hughes Bellermann LLP

(57) ABSTRACT

A stacked assembly of semiconductor devices includes a mounting pad covering a first portion of a low-side semiconductor device, and a contact layer covering a second portion of the low-side semiconductor device. A first mounting clip electrically connected to the contact layer has a supporting portion joining the first mounting clip to a first lead frame portion. A second mounting clip attached to the mounting pad has a supporting portion joining the second mounting clip to a second lead frame portion. A high-side semiconductor device has a first terminal electrically connected to the first mounting clip and thereby to the contact layer, and a second terminal electrically connected to the second mounting clip.

17 Claims, 13 Drawing Sheets

(51) Int. Cl.
    *H01L 25/00* (2006.01)
    *H01L 25/11* (2006.01)
(52) U.S. Cl.
    CPC .............. *H01L 24/08* (2013.01); *H01L 24/37* (2013.01); *H01L 24/40* (2013.01); *H01L 24/84* (2013.01); *H01L 25/117* (2013.01); *H01L 25/50* (2013.01); *H01L 2224/08245* (2013.01); *H01L 2224/37147* (2013.01); *H01L 2224/40499* (2013.01); *H01L 2224/84801* (2013.01)
(58) Field of Classification Search
    CPC ....... H01L 24/40; H01L 24/84; H01L 25/117; H01L 25/50; H01L 25/0655; H01L 2224/08245; H01L 2224/37147; H01L 2224/40499; H01L 2224/84801
    See application file for complete search history.

(56) References Cited

OTHER PUBLICATIONS

M. Romig, O. Lopez, "3D packaging advancements drive performance, power and density in power devices," TI white paper, 2011.

\* cited by examiner

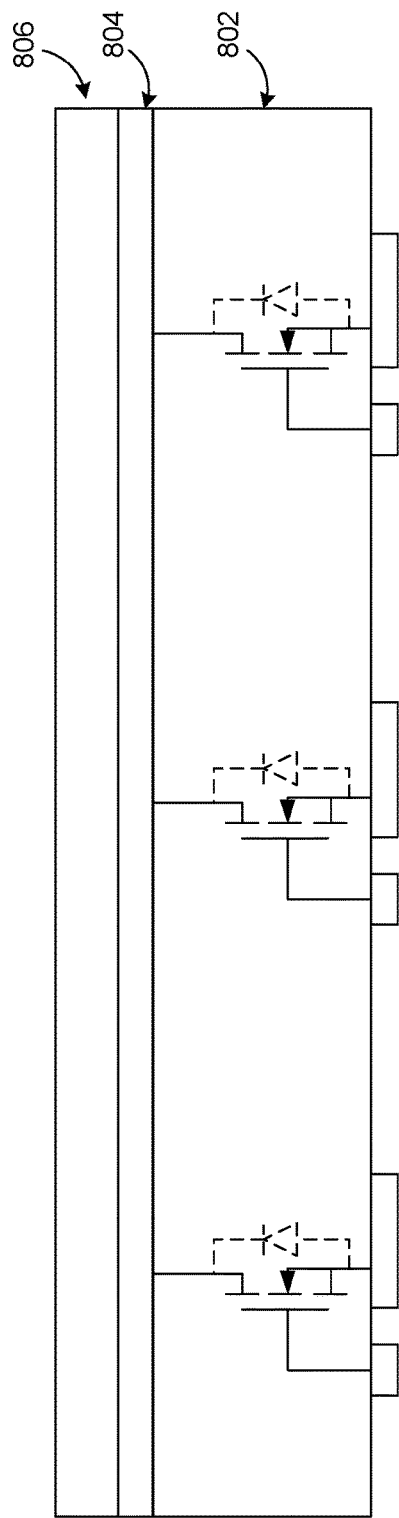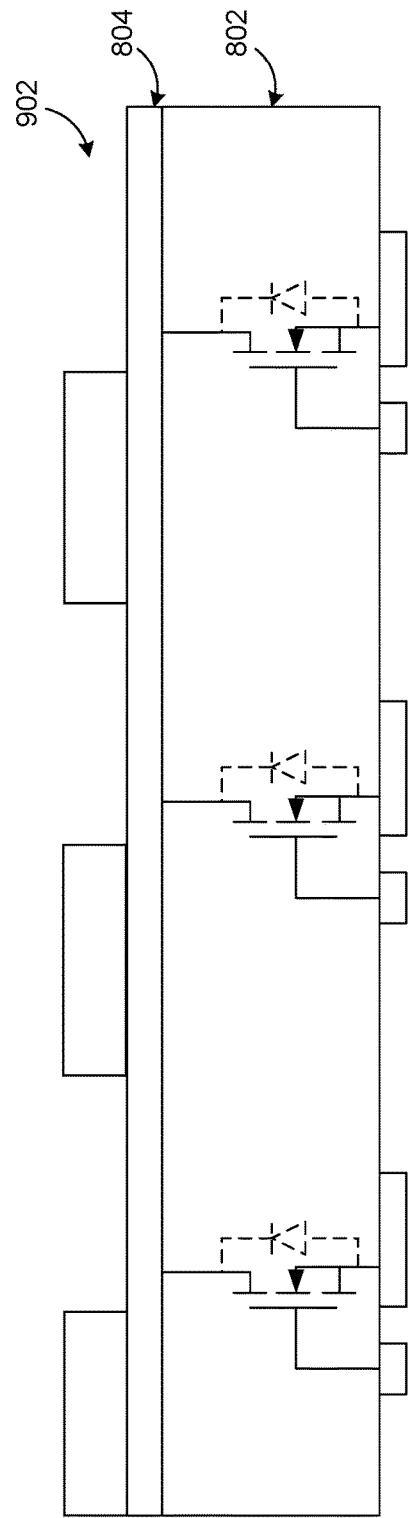

STACKED TRANSISTOR ASSEMBLY WITH DUAL MIDDLE MOUNTING CLIPS

CROSS-REFERENCE TO RELATED APPLICATIONS

This application claims the benefit of U.S. Provisional Patent Application No. 62/912,926, filed on Oct. 9, 2019, the entire contents of which is incorporated herein by reference.

TECHNICAL FIELD

This description relates to packaging techniques for semiconductor devices.

BACKGROUND

Increasing device density within a package of semiconductor devices, such as transistors, enables a more efficient use of available space within the package. It is possible to increase device density, for example, by decreasing sizes of individual devices, or by fitting a larger number of devices within available package space.

In the latter case, for example, it is possible to construct 3-dimensional (3D) assemblies of devices. For example, it is possible to stack one transistor above another transistor. In particular, it may be efficient to stack two transistors that are operating in conjunction with one another to provide one or more functions within a larger circuit.

However, mounting, wiring, and otherwise packaging 3D device assemblies may be challenging. For example, such 3D device assemblies may be prone to short circuits and structural assemblies. In other examples, 3D device assemblies may require specialized, expensive, and/or time-consuming manufacturing techniques.

SUMMARY

According to one general aspect, a semiconductor device assembly includes a low-side semiconductor device, a mounting pad covering a first portion of the low-side semiconductor device, and a contact layer covering a second portion of the low-side semiconductor device. The assembly further includes a first mounting clip electrically connected to the contact layer by a connecting portion thereof, the first mounting clip having a supporting portion joining the connecting portion of the first mounting clip to a first lead frame portion, and a second mounting clip attached to the mounting pad by a connecting portion thereof, the second mounting clip having a supporting portion joining the connecting portion of the second mounting clip to a second lead frame portion. The assembly further includes a high-side semiconductor device having a first terminal electrically connected to the first mounting clip and thereby to the contact layer, and having a second terminal electrically connected to the second mounting clip.

According to another general aspect, a stacked transistor assembly includes a low-side transistor having a low-side source contact, a low-side gate contact, and a low-side drain contact, and a high-side transistor mounted above the low-side transistor and having a high-side source contact, a high-side gate contact, and a high-side drain contact. The stacked transistor assembly includes a mounting pad covering a first portion of the low-side transistor, a gate mounting clip secured to the mounting pad and to the high-side gate contact, a contact layer covering a second portion of the low-side transistor and providing the low-side drain contact, and a source mounting clip electrically connected to the contact layer and to the high-side source contact.

According to another general aspect, a method of making a semiconductor device assembly includes forming a low-side device assembly, including a mounting pad covering a first portion of the low-side device assembly and a contact layer covering a second portion of the low-side device assembly. The method includes forming a high-side device assembly, the high-side device assembly having a first terminal and a second terminal, placing the low-side device assembly on a lead frame, and attaching a first mounting clip between the lead frame and the mounting pad. The method further includes attaching a second mounting clip between the lead frame and the contact layer, and placing the high-side device assembly with the first terminal connected to the first mounting clip and the second terminal connected to the second mounting clip.

The details of one or more implementations are set forth in the accompanying drawings and the description below. Other features will be apparent from the description and drawings, and from the claims.

BRIEF DESCRIPTION OF THE DRAWINGS

FIG. 8 illustrates a first example process step for an implementation of corresponding operations of FIG. 7.

FIG. 9 illustrates a second example process step for an implementation of corresponding operations of FIG. 7.

DETAILED DESCRIPTION

As described in detail below, embodiments include stacked devices, such as transistors, that are mounted vertically, and connected electrically, using a plurality of mounting clips. For example, at least two mounting clips may be provided that are at least partially in between, or within a middle of, at least two stacked transistors. The mounting clips enable fast, inexpensive 3D packaging of the transistors and other devices, including, in some examples, the use of standard solder connections.

Using the techniques described herein, the plurality of mounting clips are attached using at least one mounting pad that provides structural stability and integrity to the 3D stacked assembly of transistors. The at least one mounting pad may further ensure that the plurality of mounting clips are prevented from contacting one another, so that short-circuits are avoided within the package. The at least one mounting pad may itself be isolated from electrical connection within the assembly.

Figure 1A:
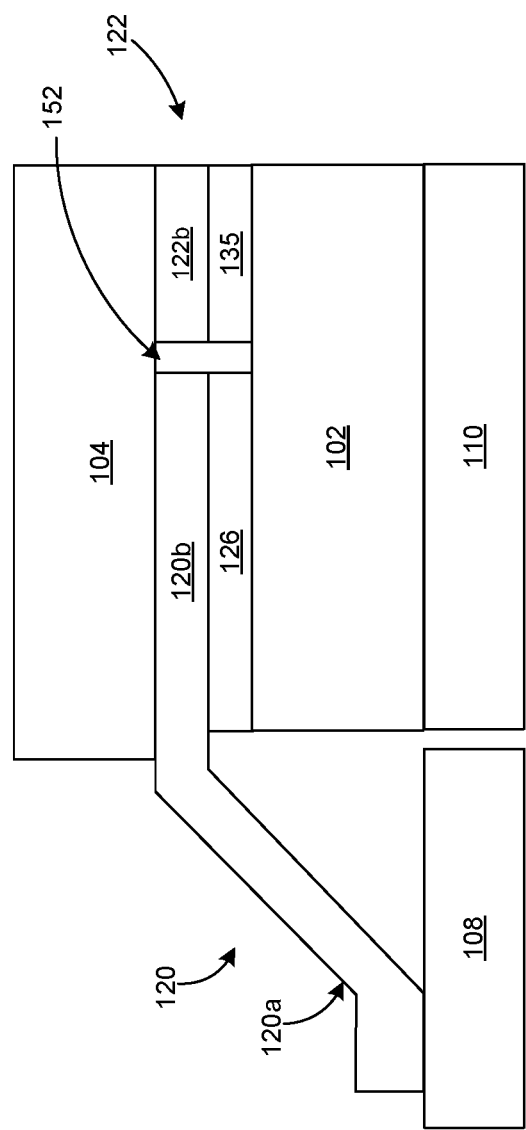
FIG. 1A illustrates a simplified cross-section of a stacked transistor assembly with dual middle mounting clips, according to some example implementations.
Figure 1B:
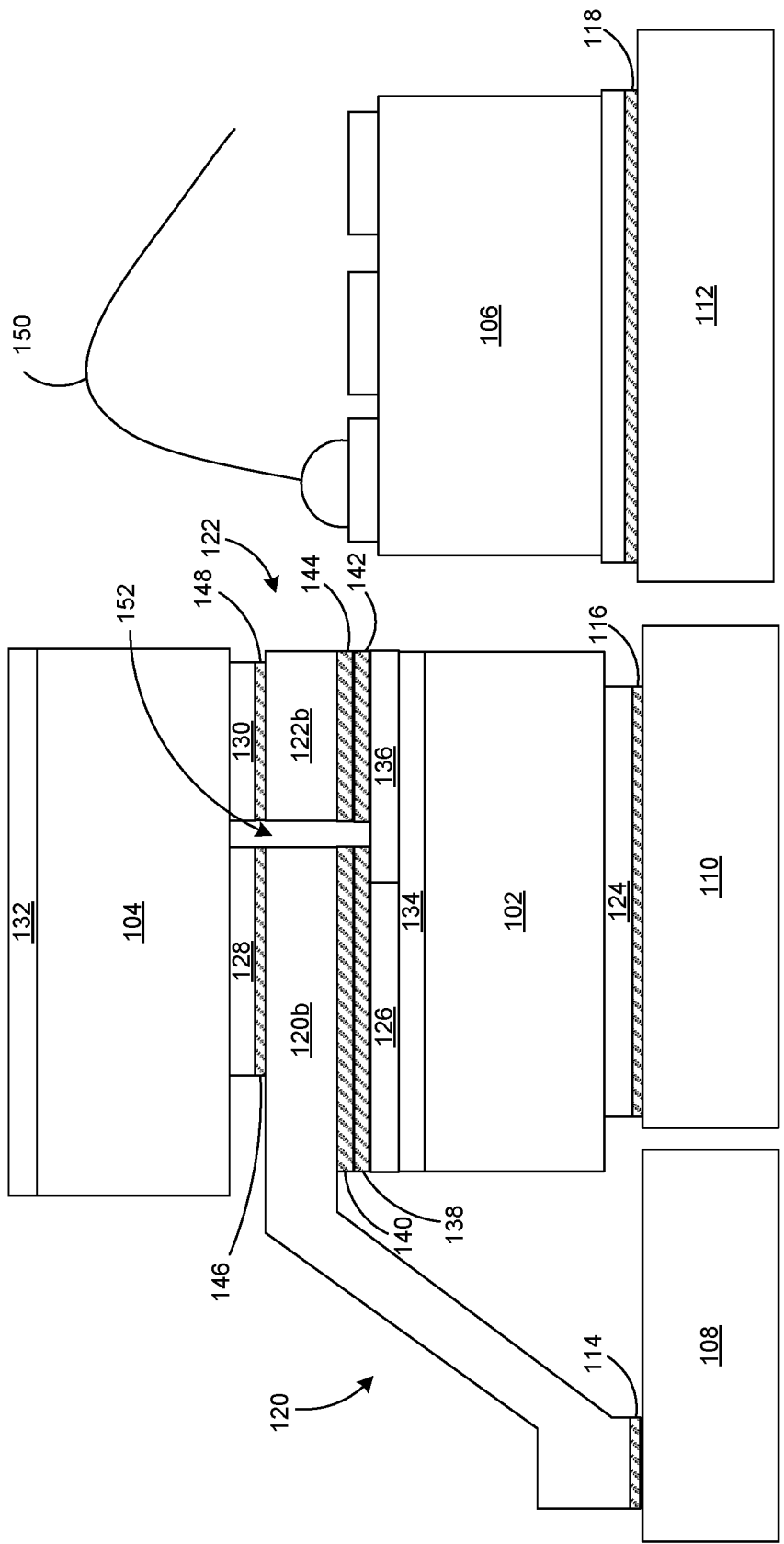
FIG. 1B illustrates a more detailed cross-section of the stacked transistor assembly with dual middle mounting clips of FIG. 1A.

FIG. 1A illustrates a simplified cross-section of a stacked transistor assembly with dual middle mounting clips, according to some example implementations. FIG. 1B illustrates a more detailed example cross-section of the stacked transistor assembly with dual middle mounting clips of FIG. 1A. As described in detail, below, FIG. 1B provides a cross section A-A' of a top view shown in FIG. 2, while FIG. 3 provides a cross section B-B' of FIG. 2.

Consequently, FIG. 1A illustrates a low-side transistor 102, above which a high-side transistor 104 is stacked. Operations of the low-side transistor 102 and the high-side transistor 104 may be governed by a controller (e.g., control chip, or control circuit) 106 (shown in FIG. 1B).

In FIG. 1A, the low-side transistor 102 is mounted on a first lead frame portion 110. A mounting pad 135, which may include multiple layers as described and illustrated below, covers a first portion of the low-side transistor 102. A contact layer 126 covers a second portion of the low-side transistor 102.

As also illustrated, a first mounting clip 120 is electrically connected to the contact layer 126 by a connecting portion 120b thereof. The first mounting clip 120 has a supporting portion 120a joining the connecting portion 120b of the first mounting clip 120 to a first lead frame portion 108. Meanwhile, a second mounting clip 122 is attached to the mounting pad 135 by a connecting portion 122b thereof. Not visible in the cross-sections of FIGS. 1A and 1B, but illustrated in FIG. 2, the second mounting clip 122 has a supporting portion 122a joining the connecting portion 122b of the second mounting clip 122 to a second lead frame portion.

The high-side transistor 104 has a first terminal, such as a source terminal, coupled to the first mounting clip 120, and is electrically connected to the first mounting clip 120, and thereby to the contact layer 126. The high-side transistor 104 has a second terminal, such as a gate terminal, coupled to the second mounting clip 122, and electrically connected to the second mounting clip.

In FIG. 1A, as referenced above, the mounting pad 135 provides structural stability and integrity to the structure of the stacked transistor assembly of FIG. 1A. The mounting pad 135 enables and facilitates use of the mounting clips 120, 122 in between, or within a middle of, the stacked transistors 102, 104, so that manufacturing and assembly of the stacked assembly of FIG. 1A may be performed efficiently and inexpensively. Further, the mounting pad 135 defines and ensures a gap 152 that provides electrical isolation between the clips 120, 122, and thereby avoids any undesired connections or short-circuits between terminals of the transistors 102, 104.

As already referenced, FIG. 1B provides a more detailed example cross-section corresponding to FIG. 1A, and uses the same reference numerals for FIG. 1A for corresponding elements. In FIG. 1B, and in ensuing examples provided herein, the term "vertical" should be understood to refer to a direction that is perpendicular to a planar surface or area of a chip, die, circuit board, or any suitable mounting frame on which stacked transistor assemblies may be mounted. Further, the terms "low" and "high" (and similar terms, such as up/down, or above/below) should be understood to refer to relative positions or distances along such a vertical direction. The term "horizontal" thus refers to the direction, or planar surface or area, that is perpendicular to the vertical direction, while the term "diagonal" may refer to any direction having both a vertical and horizontal component.

In FIG. 1B, physical support for the controller 106 and the transistors 102, 104, as well as electrical connections therebetween, may be provided by multiple lead frames or lead frame portions 108, 110, 112. For example, such lead frames are commonly implemented as metal structures used to provide electrical connections between a die inside a chip package to external circuits. In some implementations, corresponding solder layers 114, 116, 118 may be used to connect the lead frames 108, 110, 112 to the transistors 102, 104, or the controller 106.

The metal mounting clip 120 is illustrated as including a diagonal portion 120a, and a horizontal portion 120b that is at least partially between the transistors 102, 104. A second mounting clip 122 is illustrated in FIG. 1B as including a horizontal portion 122b that is at least partially between the transistors 102, 104, with a diagonal portion 122a being visible in FIG. 2.

For example, the mounting clips 120, 122 may represent copper clips. Copper clips may be used to provide a number of advantages over wire-bonded approaches, including reducing an overall electrical resistance and thermal impedance of a package, particularly for power electronics and high frequency applications.

In the example of FIG. 1B, as illustrated and as constructed using the techniques described herein, both the mounting clip 120 and the mounting clip 122 may each include at least a portion (e.g., portions of horizontal portions 120b, 122b) in between, or within a middle of, the low side transistor 102 and the high side transistor 104. The horizontal portions 120b, 122b provide structural support and integrity for the stacked transistor assembly of FIG. 1B, while being maintained in electrical isolation from one another. More generally, the structure of FIG. 1B enables all necessary electrical connections between the transistors 102, 104, the controller 106, and the lead frames 108, 110. The structure of FIG. 1B also ensures electrical isolation between the clips 120, 122, and, similarly, avoids any short-circuit between the transistors 102, 104, or otherwise within the stacked assembly of FIG. 1B (such as between the clip 122 and a low-side drain contact 126, as described below).

In FIG. 1B, and in the following description, the transistors 102, 104 are illustrated and described as vertical field-effect transistors, each having a gate, source, and drain. However, other types of transistors or semiconductor devices may be used, as well. Further, internal structural or operational details of any such devices, including the transistors 102, 104 (e.g., channels, or doped regions), are not described in detail in the present description.

Nonetheless, for purposes of explaining the stacked assembly of FIG. 1B, the low-side transistor 102 is illustrated as including a low-side source contact 124 and a low-side drain contact 126. The low-side transistor 102 includes a low-side gate contact as well, not visible in FIG. 1B, but shown as low-side gate contact 214 in FIG. 2. Similarly, the high-side transistor 104 includes a high-side source contact 128, a high-side gate contact 130, and a high-side drain contact 132.

Thus, the lead frame 110 may be understood to represent a low-side source lead frame joined by the solder layer 116 to the low-side source contact 124. The low-side source contact supports the low-side transistor 102. With the low-side source contact 124 position below the low-side drain contact 126, the low-side transistor 102 may be referred to as a face-down transistor.

Further in FIG. 1B, a blanket metal layer 134 is illustrated between the low-side drain contact 126 and an insulating layer 136. As illustrated in FIG. 1B, and as described in detail, below, the blanket layer 134 may be extended across an entirety of a top surface of the low-side transistor 102, and may shunt current from the drain contact 126 across an entirety of the low-side transistor, including a portion under the insulating layer 136, to thereby increase or maximize available current flow through the low-side transistor 102.

A layer 138 represents one or more of an adhesion and a wetting layer that facilitates contact and connection between the low-side drain 126 and a solder layer 140. For example, the layer 138 may include titanium included for adhesion to the low-side drain contact 125, and copper that weds the titanium to the solder layer 140. Similarly, a layer 142 may provide similar functions with respect to adhering the insulating layer 136 to a solder layer 144. For example, although shown as a single layer(s) 138/142, such layers may be formed using, e.g., an approximately 30 nm layer of Titanium and an approximately 150 nm layer of Copper.

In this way, the solder layer 140 may connect to the mounting clip 120, while the solder layer 144 may connect to the mounting clip 122. As may be observed from FIG. 1B, and as described herein, the mounting clip 122 is electrically isolated from the low-side transistor 102, and in particular, from the low-side drain 126. The mounting clip 122 is also securely and reliably isolated from the mounting clip 120.

At the same time, the mounting clip 120 is secured to the high-side source contact by a solder layer 146, while the mounting clip 122 is secured to the high-side source contact by a solder layer 148. Accordingly, the high-side transistor 104 as a whole is structurally supported and maintained by the mounting clips 120, 122, and adjoining layers.

For operation of the transistors 102, 104, the controller 106 may be connected by wirebond, represented in FIG. 1B by a single wirebond 150, to each of the low-side source contact 124, low-side drain contact 126, low-side gate contact 214, high-side source contact 128, high-side gate contact 130, and high-side drain contact 132. The controller 106 may be grounded through grounded lead frame 112. In other implementations, the lead frame 112 may represent a connection to a power supply rail. Operations of the transistors 102, 104 may thus be controlled in a desired manner, for example, by applying appropriate gate voltages and controlling a current flow travelling through the high-side drain contact 132, the high-side source contact 128, mounting clip 120, the low-side drain contact 126, and the low-side source contact 124.

In the example of FIG. 1B, a gap or space 152 is thus formed that ensures electrical isolation between the mounting clips 120, 122. In example implementations, the gap 152 may be, e.g., in a range of 50-100 microns. As described, the gap 152 is maintained securely and reliably through the connection of the mounting clip 122 to the mounting pad formed by a combination of at least some of the layers 136, 142, 144. That is, the term mounting pad in the present description should be understood to represent any one or more layers used to support the mounting clip 122, or similar mounting clip included at least partially between the transistors 102, 104 (e.g., layers 136, 142, 144). As described, such a mounting pad electrically isolates the mounting clip 122 from the low-side transistor 102 and from the mounting clip 120 (in the latter case, by way of the gap 152, just referenced).

In FIG. 1B, the mounting clip 120 is connected to the high-side source contact 128, and may be referred to as a source clip, or source-side clip. If the high-side source contact is used as an output node, the mounting clip 120 may be referred to as an OUT clip, or output clip. Similarly, as the mounting clip 122 supports the high side gate contact 130, the mounting clip 122 may be referred to as a gate clip, or gate-side clip.

Figure 2:
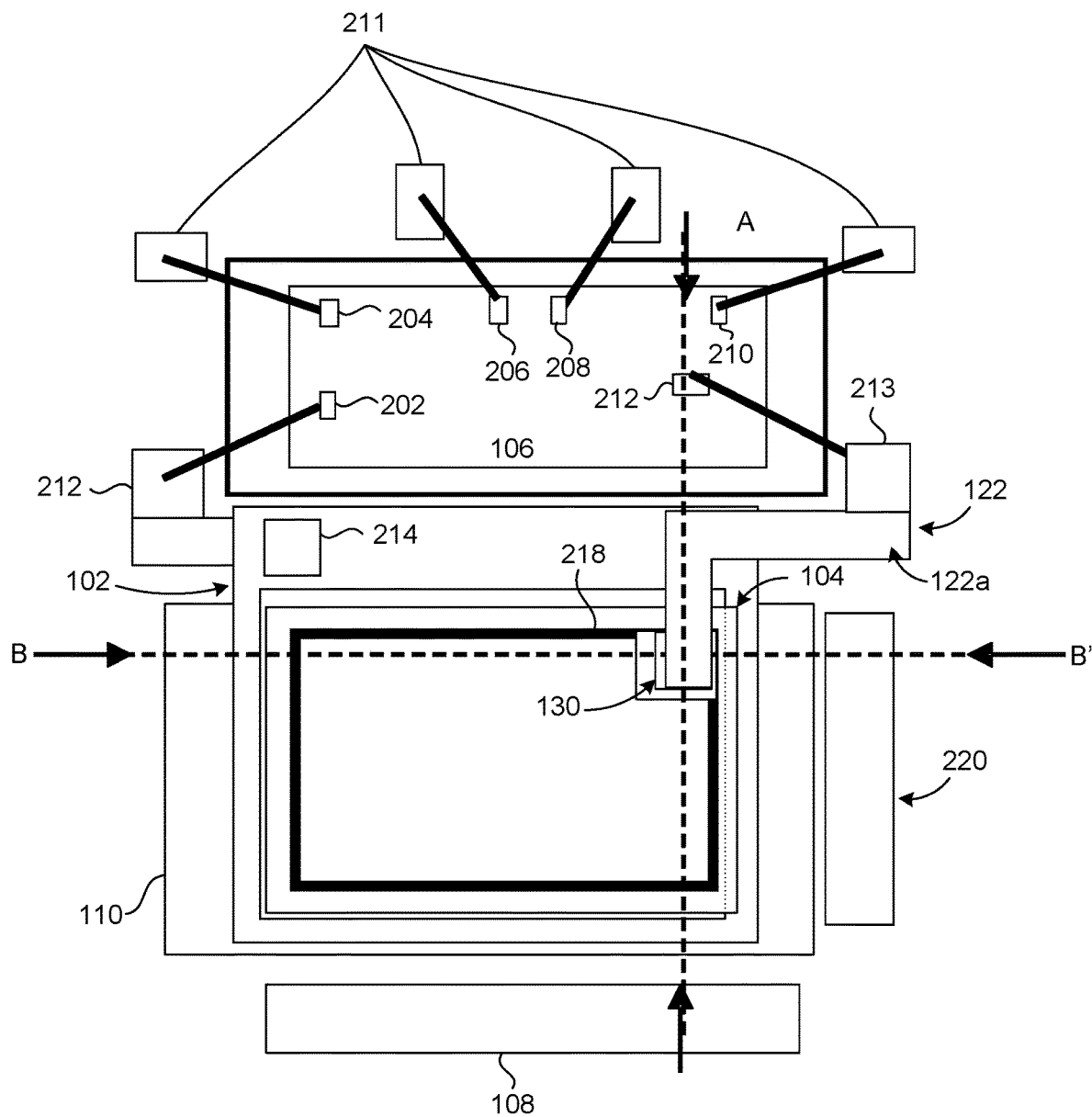
FIG. 2 illustrates a top view of the stacked transistor assembly of FIG. 1B.
Figure 3:
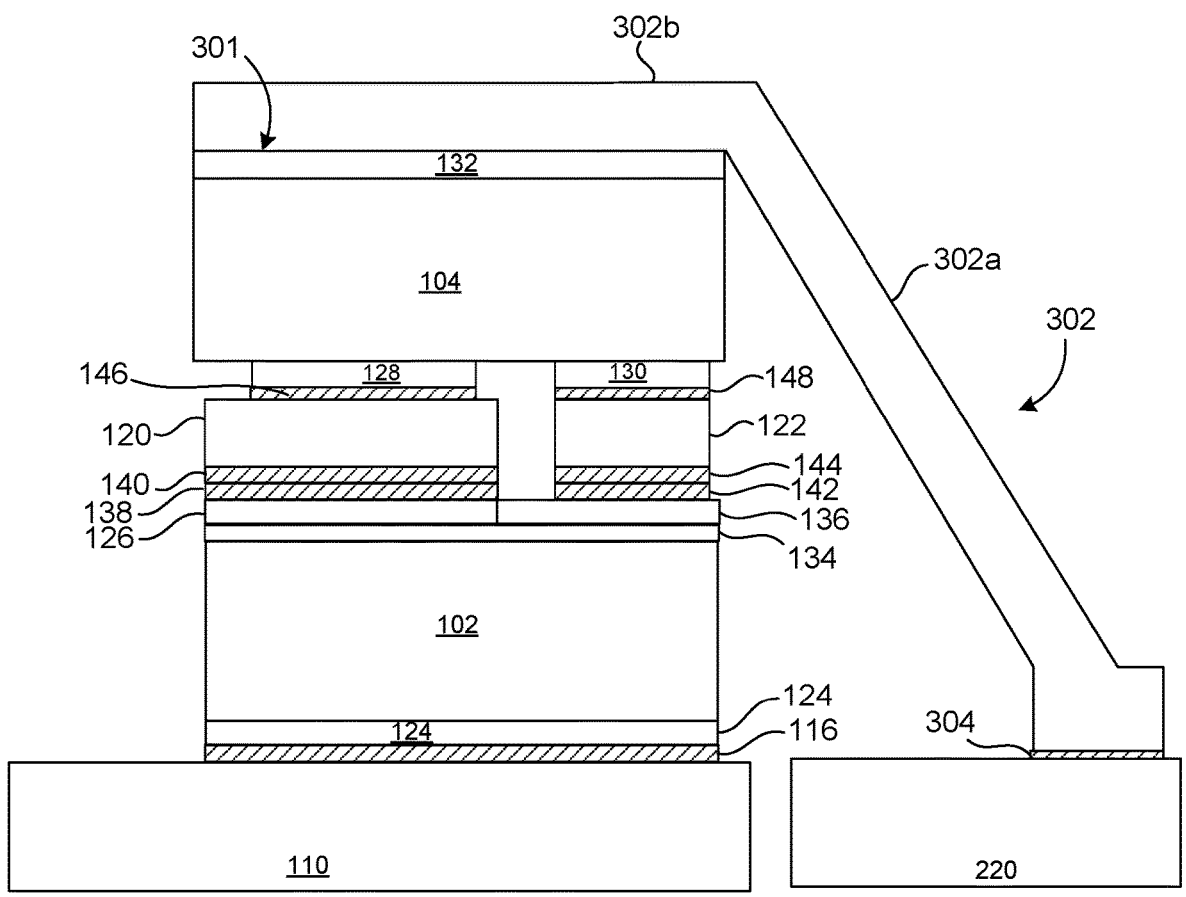
FIG. 3 is a second cross-section of the stacked transistor assembly of FIGS. 1B and 2.

In the top view of FIG. 2, the lead frame 110 and the lead frame 108 are illustrated, although the connection of the lead frame 108 to the mounting clip 120, and thereby to the high side source 128, is not visible in FIG. 2.

In FIG. 2, the controller 106 is illustrated as having six terminals 202, 204, 206, 208, 210, 212, each of which is wirebond-connected to a corresponding leadframe(s), 211, 212, 213. Specifically, lead frames 211 correspond, for example, to lead frames 108, 110, 220 of the stacked transistor assembly, although explicit correspondence is not illustrated in FIG. 2 for the sake of brevity. Lead frame 212, however, is illustrated as connecting to the low-side gate 214, while lead frame 213 is illustrated as being connected to mounting clip 122, including a diagonal portion 122a.

Further in FIG. 2, a low-side source pad 216 (corresponding to low-side source contact 124 in FIG. 1) is outlined transparently to illustrate a high-side source pad 218 (corresponding to high-side source contact 128 in FIG. 1), as well. Finally in FIG. 2, a lead frame 220 corresponds to a third mounting clip 302, which attaches to the high-side drain 132, as shown in FIG. 3.

Specifically, in FIG. 3, a cross-section taken along line B-B' illustrates that the third mounting clip 302 may be soldered to the lead frame 220 using solder layer 304. The third mounting clip includes a diagonal portion 302a, as well as a horizontal portion 302b connected to the high-side drain 132 using solder layer 301.

Figure 4:
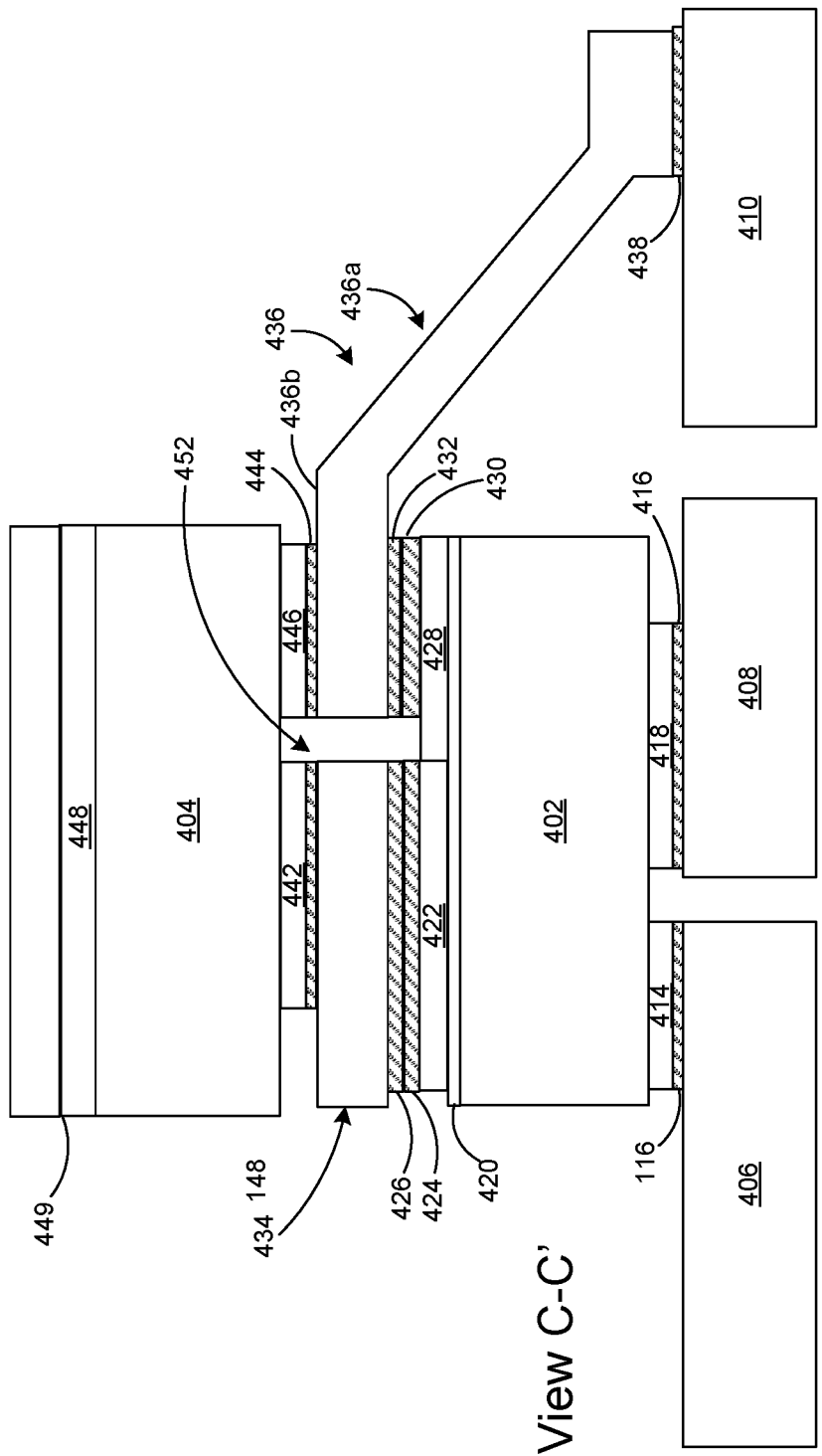
FIG. 4 illustrates a first cross-section of a second implementation of a stacked transistor assembly with dual middle mounting clips, according to some example implementations.
Figure 5:
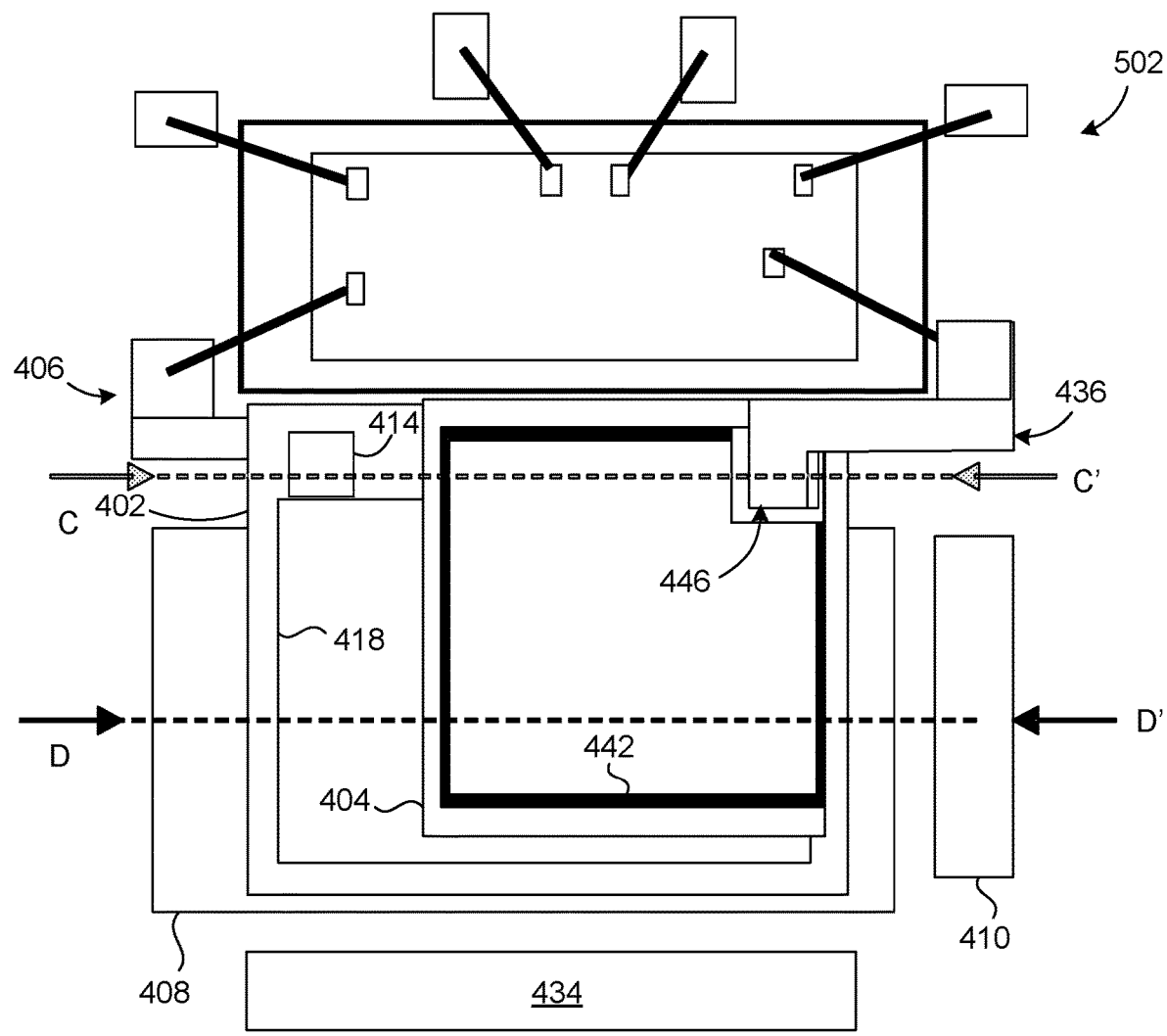
FIG. 5 illustrates a top view of the stacked transistor assembly of FIG. 4.

FIG. 4 illustrates a first cross-section of a second implementation of a stacked transistor assembly with dual middle mounting clips, taken along a line C-C', and according to some example implementations. FIG. 5 illustrates a top view of the stacked transistor assembly of FIG. 4.

In FIG. 4, as in FIG. 1B, a low-side transistor 402 and a high-side transistor 404 are stacked on, or using, lead frames 406, 408, and 410. As shown, the lead frame 406 is attached by solder layer 412 to low-side gate contact 414. The lead frame 408 is attached by a solder layer 416 to a low-side source contact 418.

A blanket metal layer 420 is formed across an entirety of the upper surface of the low-side transistor 402. As described, the blanket metal layer 420 shunts current across an entirety of the low-side transistor 402, thereby optimizing current flow through the low-side transistor 402.

A low-side drain contact 422 has one or more adhesion/wetting layer(s) 424 formed thereon. Accordingly, a solder layer 426 may reliably be formed on the adhesion/wetting layer(s) 424. Similarly, an insulator layer formed adjacent to the low-side drain contact 422 and covering a remainder of a surface of the blanket metal layer 420 has one or more adhesion/wetting layer(s) 430 formed thereon. Accordingly, a solder layer 432 may be formed on the adhesion/wetting layer(s) 430.

As further illustrated, a mounting clip 434 may be attached to the solder layer 426 and to a solder layer 440, and thereby to a high-side source contact 442. Similarly, a mounting clip 436 may be attached by a solder layer 438 to lead frame 410 at one end, and attached by a solder layer 444 to a high-side gate 446 at the other end. As shown, the mounting clip 436 has a diagonal portion 436a and a horizontal portion 436b. Finally in FIG. 4, the high-side transistor 404 may have a high-side drain contact 448 connected to a mounting clip 450 by a solder layer 449.

As with the example of FIG. 1B, the example of FIG. 4 provides a gap 452 separating the clips 434, 436. Also as with FIG. 1B, the mounting clip 436 is electrically isolated and insulated from the low-side transistor 402, while being fully supported and providing structural integrity for the stacked assembly of FIG. 4.

In the top view of FIG. 5, a controller 502 is illustrated in a manner that generally corresponds with the controller 106 of FIGS. 1 and 2, and is not described in further detail here. FIG. 5 illustrates that the transistors 402, 404, and corresponding source contacts 418, 442, may be formed in different configurations (e.g., as compared to the example of FIG. 2).

For example, as shown in FIG. 5, the gate contacts 414, 446 may be aligned with one another. Further, source contacts 418, 442 may have various configurations and patterns that are compatible with the dual middle mounting clip techniques described herein.

Figure 6:
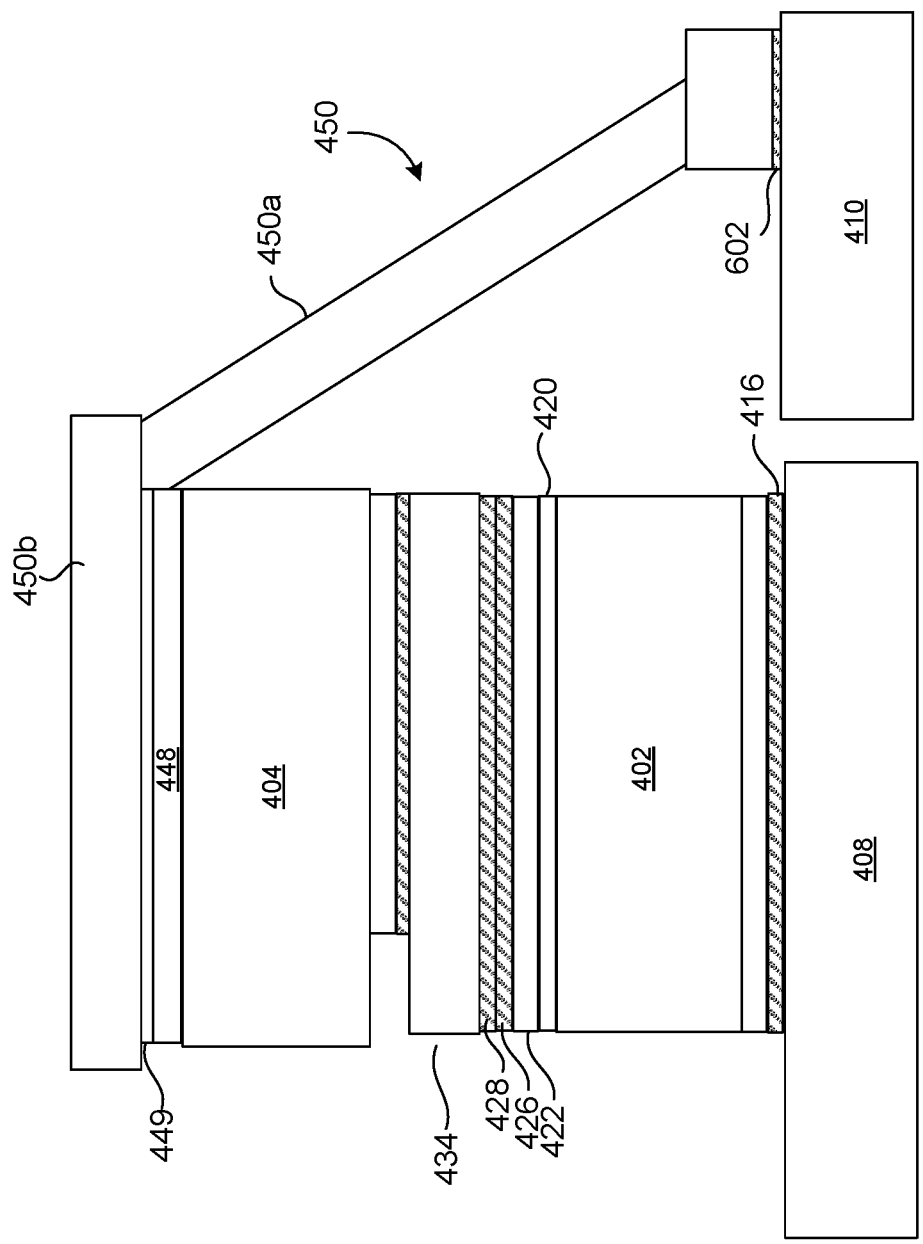
FIG. 6 is a second cross-section of the stacked transistor assembly of FIGS. 4 and 5.

FIG. 6 is a second cross-section of the stacked transistor assembly of FIGS. 4 and 5, taken along a line D-D'. FIG. 6 illustrates that the top, drain mounting clip 450 may be attached to the lead frame 410 by a solder layer 602. The mounting clip 450 is illustrated as including a diagonal portion 450a and a horizontal portion 450b.

Figure 7:
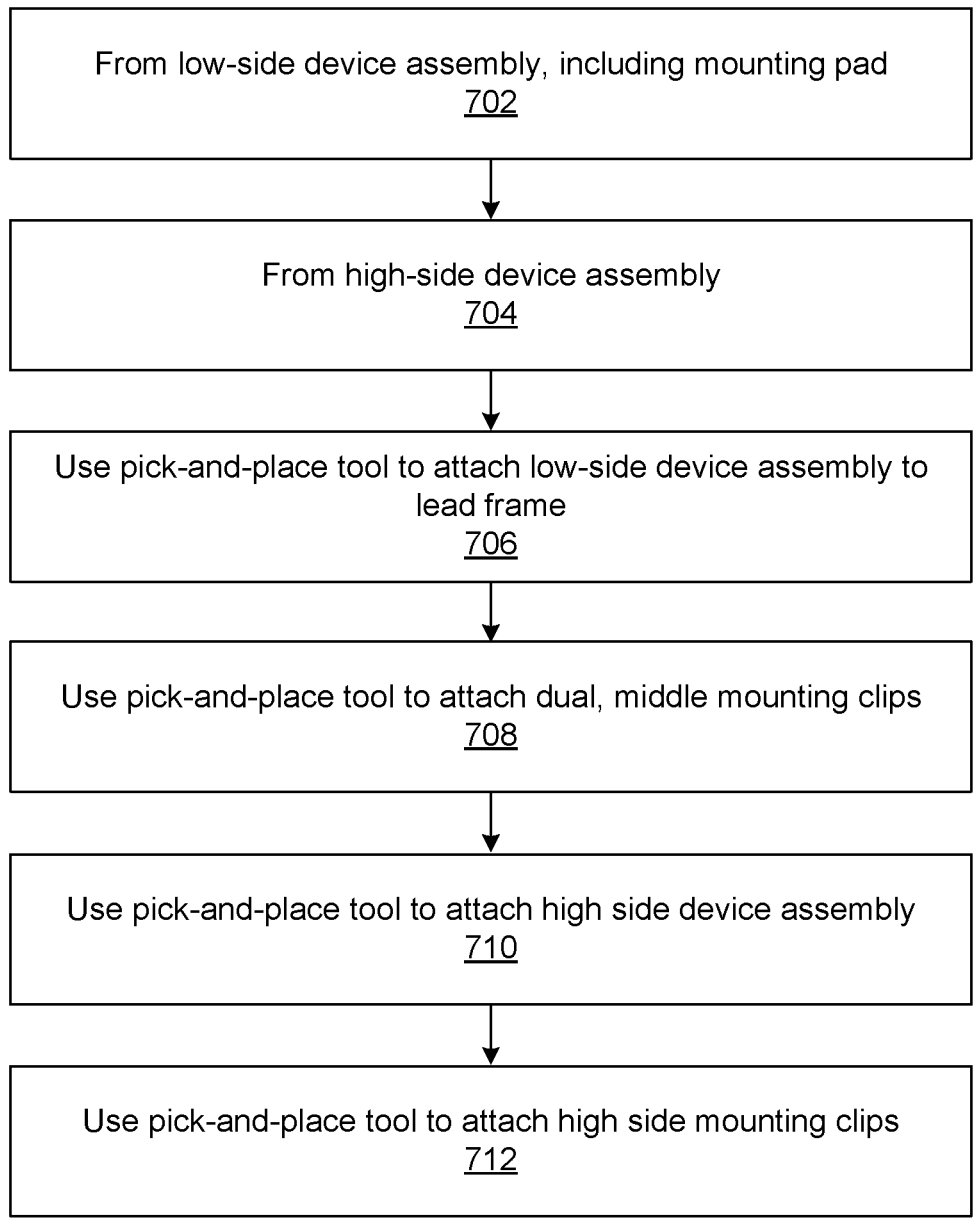
FIG. 7 is a flowchart illustrating example operations for constructing the stacked transistor assemblies of FIGS. 1-6.

FIG. 7 is a flowchart illustrating example operations for constructing the stacked transistor assemblies of FIGS. 1-6. In the example of FIG. 7, a low-side device assembly may be formed, including a mounting pad (702). For example, as described, the low-side device may include a low-side transistor, such as a facedown, vertical trench MOSFET (Metal Oxide Semiconductor Field Effect Transistor). The mounting pad may include an insulating layer that is covering a first portion of the low-side device, while a contact layer (e.g., a drain contact of a vertical MOSFET) covers a second portion of the low-side device.

A high-side device assembly may be formed (704). For example, another facedown, vertical trench MOSFET may be formed.

The low-side device assembly may be attached to a lead frame, e.g., using a pick-and-place tool (706). For example, a solder layer may be used, such as the solder layer 116 of FIG. 1B, or the solder layers 412, 416 of FIG. 4. As described, the low-side device assembly may include a mounting pad that includes an insulating layer (e.g., 136 in FIG. 1), an adhesion layer/a wetting layer (e.g., 142 in FIG. 1), and a solder layer (e.g., 144 in FIG. 1). As illustrated and described above with respect to FIGS. 1-6, the mounting pad covers a first portion of the low-side device (e.g., low-side transistor 102, 402), while a contact layer (e.g., low-side drain contact 136 in FIG. 1) covers a second portion of the low-side device.

Dual, middle mounting clips may be attached using a pick-and-place tool (708). For example, the source mounting clip 120 may be placed using solder layers 114 and 140, so as to be electrically connected to the contact layer by a horizontal portion 120b thereof, while a diagonal portion 120a joins the horizontal portion 120b of the source mounting clip 120 to a first (source) lead frame 108.

Meanwhile, the gate mounting clip 122 may be placed using solder layer 144. Specifically, as shown, the gate mounting clip 122 may be placed using the above-referenced mounting pad that includes the layers 136/142/144. Thus, similar to the source mounting clip, the gate mounting clip is effectively attached to the mounting pad by a horizontal portion 122b thereof, the second mounting clip having a diagonal portion 122a joining the horizontal portion 122b of the second mounting clip to a second (gate) lead frame 213.

A high-side device assembly may be attached to the dual middle mounting clips, using a pick-and-place tool (710). For example, the high-side transistor 104 of FIG. 1B, or 404 of FIG. 4, may be attached using solder layers 146, 148, or 440, 444. Thus, the high-side semiconductor device may have a first terminal or contact mounted on the first mounting clip and electrically connected to the first mounting clip and to the contact layer. For example, the high-side transistor 104 has a high-side source terminal or contact mounted on the source mounting clip 120 and thereby is connected to the low-side drain contact 126. The high-side transistor 104 further has a high-side gate terminal or contact mounted on the second mounting clip that is electrically connected to the second mounting clip.

A high-side mounting clip may be attached using the pick-and-place tool (712). For example, the high-side drain clip 302 of FIG. 3 may be attached as illustrated therein, or the high-side drain clip 450 of FIGS. 4 and 6 may be attached as illustrated therein.

FIGS. 8-12 illustrate process steps for forming a low-side device assembly, such as may be used in specific example implementations of operation 702 of FIG. 7. In the example of FIG. 8, a low-side device layer 802 includes a plurality of devices, illustrated in FIG. 8 as facedown, vertical transistors. In example implementations, such a low-side device wafer as illustrated in FIG. 8 may be attached to a glass carrier using a suitable adhesive, and may undergo desired thinning or other process steps, that are not illustrated in FIG. 8 in detail. The glass carrier may be removed prior to dicing.

In FIG. 8, a Titanium/Copper seed layer 804 may be deposited for use as the blanket metal layer 134 of FIG. 1B, or 420 of FIG. 4. Then, an insulator layer 806, such as $SiO_2$ or a suitable polymer, may be deposited onto the seed layer 804.

In FIG. 9, the insulator layer 806 may be patterned to form patterned insulator layer 902. For example, patterning may be performed using a photosensitive insulator, or a photoresist mask followed by etching.

Figure 10:
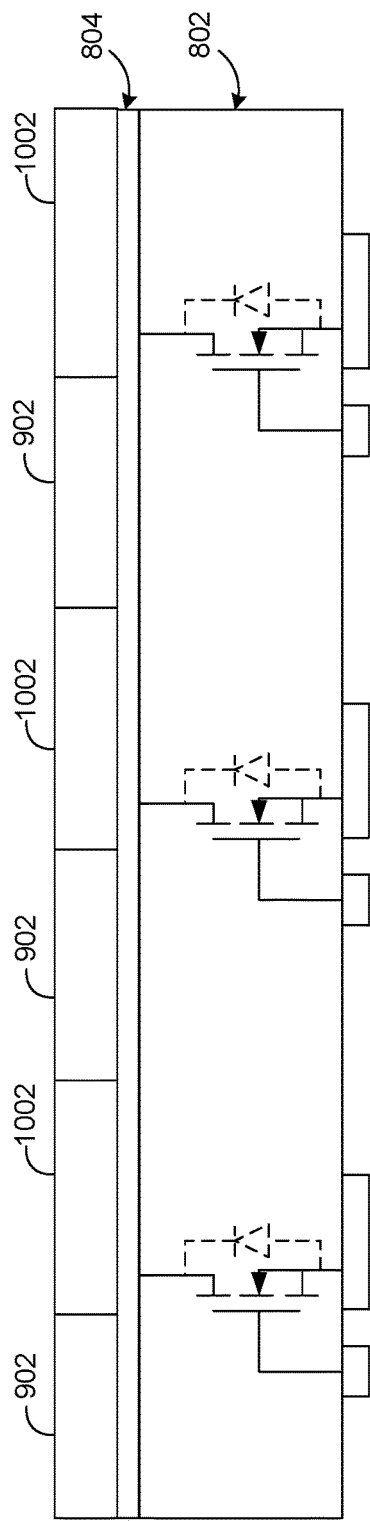
FIG. 10 illustrates a third example process step for an implementation of corresponding operations of FIG. 7.

FIG. 10 illustrates deposition of Copper (Cu) drain contacts 1002 using electroplating. More specifically, a plate-through-oxide (PTO) approach may be used in which electroplating using the seed layer 804 is conducted in a pattern that is dictated by the existing oxide structures 902. For example, the wafer in FIG. 9 may be immersed into a copper-ion containing solution while a potential is applied to the wafer, whereby Cu electroplating may proceed due to the presence of the Cu in the seed layer 804. Following Cu electroplating, a chemical mechanical polish (CMP) may be conducted if improved planarity is required or desired.

Figure 11:
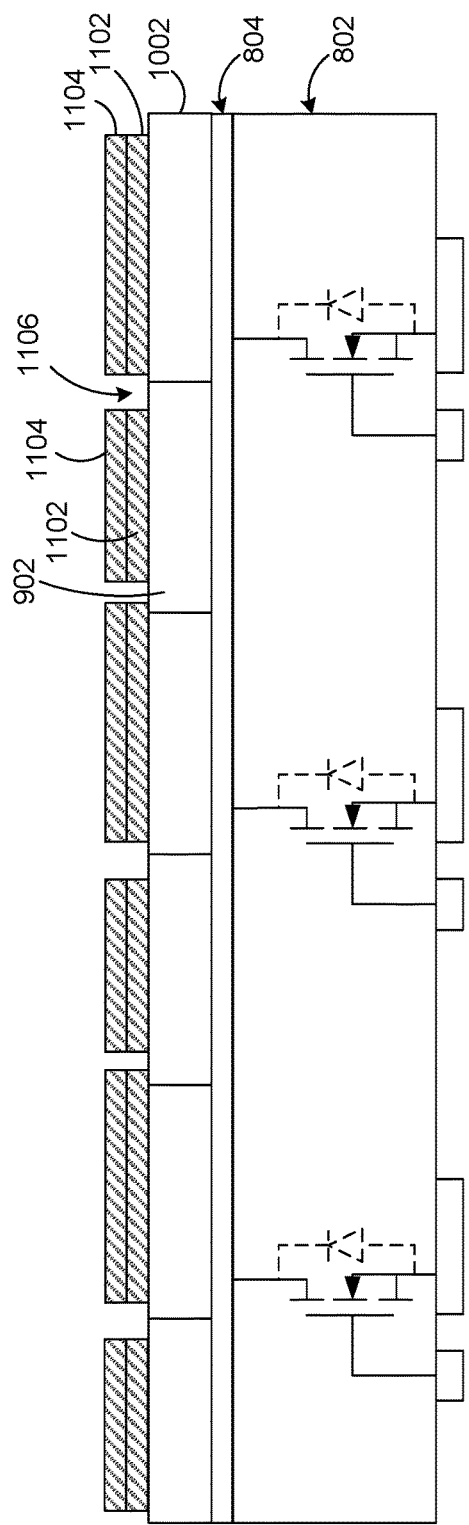
FIG. 11 illustrates a fourth example process step for an implementation of corresponding operations of FIG. 7.

In FIG. 11, an adhesion/wetting layer 1102 is formed using Ti and Cu, similar to the formation of the blanket layer 804. Therefore, again, electroplating may proceed using the Cu in the layer 1102. In particular, for example, a plate-through-resist process may be conducted, in which a patterned photoresist provides openings to electroplate solder layer contacts 1104, as shown in FIG. 11. A resist strip followed by a metal etch may then be used to conduct an etching process that provides separation 1106 between stacked pairs 1102/1104. Then, removal of the glass carrier referenced above may proceed, followed by dicing of the wafer into individual low-side devices.

Figure 12:
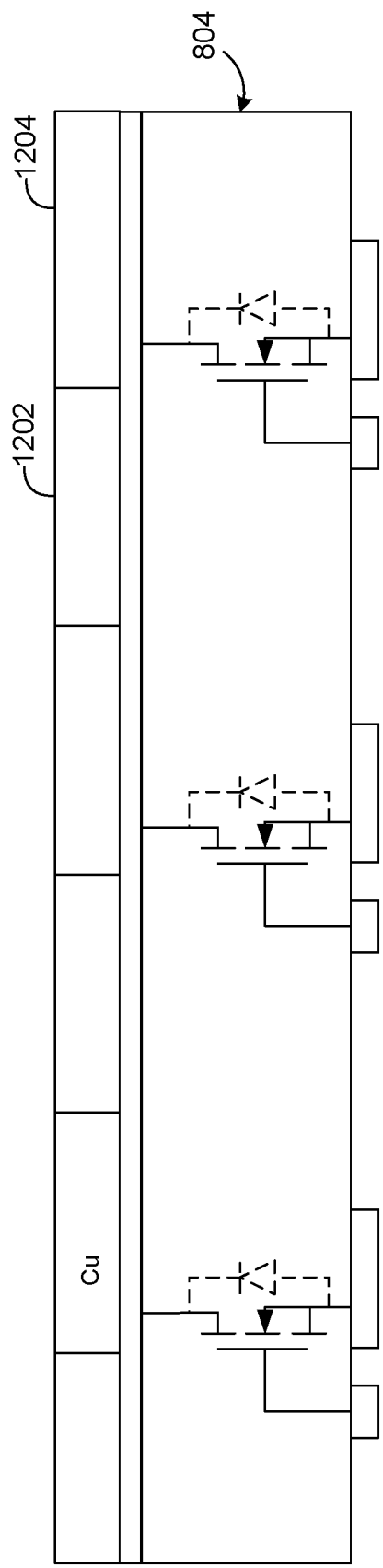
FIG. 12 illustrates a fifth example process step for an implementation of corresponding operations of FIG. 7.

FIG. 12 illustrates an alternate example implementation, in which a blanket metal layer is not included. In this case, the above-described plate-through-oxide (PTO) electroplating option is not available. Instead, following deposition of an insulator (e.g., $SiO_2$), and subsequent patterning, a damascene process may be used to form the copper drain contact 1204. For example, a damascene process may be used to deposit Cu, which may then undergo CMP for planarization. Then, the processes already described above with respect to FIG. 11 (e.g., plate-through-resist (PTR)) may be used to form an adhesion/wetting layer and solder layer, corresponding to layers 1102 and 1104 in FIG. 11, respectively.

Figure 13:
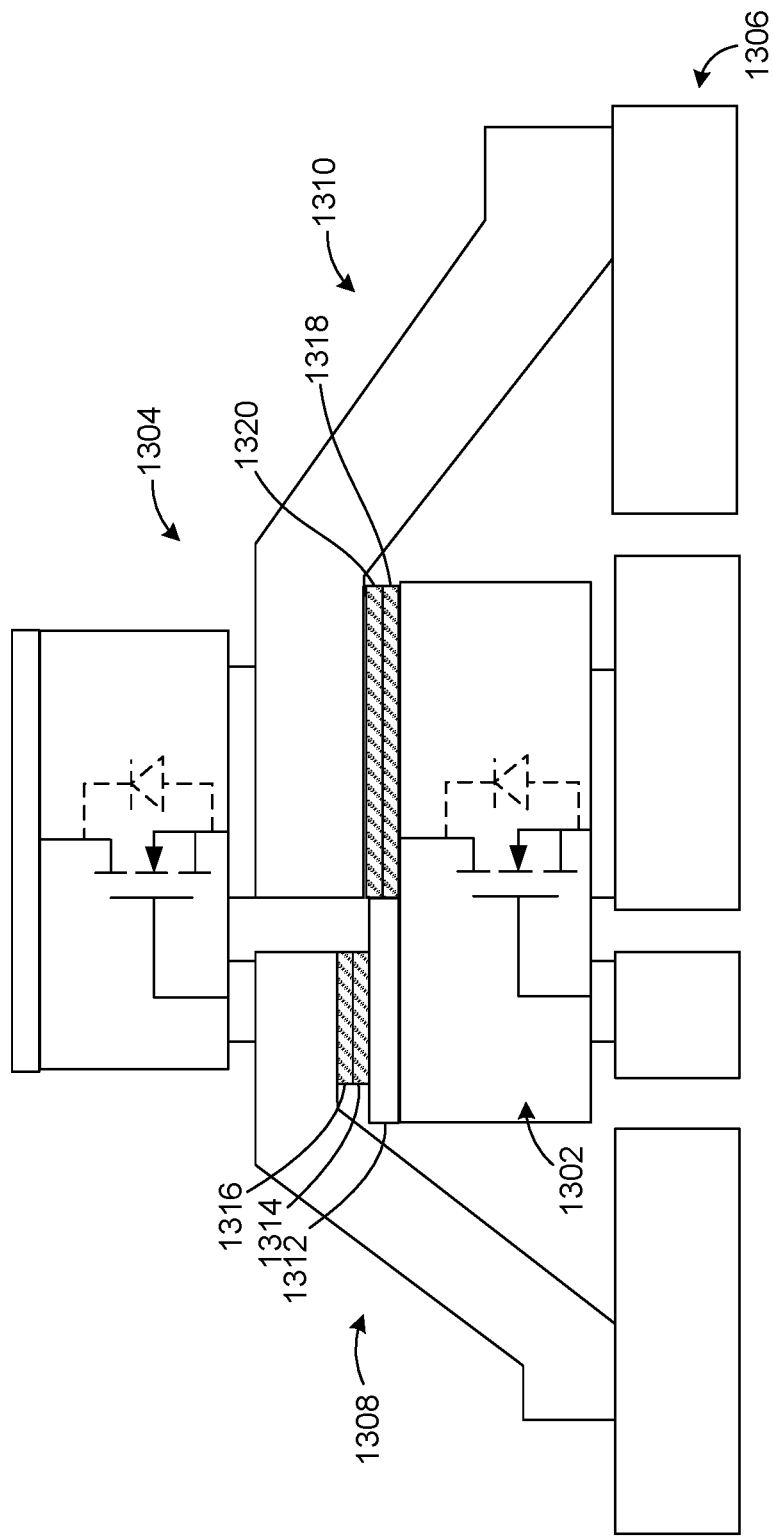
FIG. 13 is a cross-section of a third example implementation of a stacked transistor assembly with dual middle mounting clips.

FIG. 13 illustrates an alternate implementation of a stacked transistor assembly with dual middle mounting clips. In FIG. 13, a low-side transistor 1302 has a high-side transistor 1304 stacked thereon, and is mounted on a lead frame 1306. Further, dual middle mounting clips 1308 (on a gate side of the high-side transistor 1304) and 1310 (on a source side of the high-side transistor 1304) are mounted on the lead frame 1306.

FIG. 13 includes a mounting pad for the gate-side mounting clip 1308 that includes an insulator layer 1312, an adhesion and wetting layer 1314, and a solder layer 1316. As described above with respect to FIGS. 1-6, the mounting pad 1312/1314/1316 provides structural stability to the stacked transistor assembly, while ensuring electrical isolation between the gate mounting clip 1308 and the source mounting clip 1310.

Also in FIG. 13, an adhesion and wetting layer 1318 facilitates inclusion of solder layer 1320. Accordingly, the source-side mounting clip 1310 is electrically connected to a drain of the low-side transistor 1302, and to the source of the high-side transistor 1304.

In FIG. 13, the mounting pad 1312/1314/1316 is at a different vertical height than the solder layer 1320. As described and illustrated below with respect to FIGS. 14 and 15, it may be easier and less expensive to manufacture the assembly of FIG. 13 in this manner. For example, fewer processing steps may be required than in the examples of FIGS. 8-12.

Nonetheless, planarity of top surfaces of the mounting clips 1308, 1310 may be maintained, as shown in FIG. 13, so that the high-side transistor 1304 remains stable, and securely mounted above the low-side transistor 1302. For example, as shown, a relative thickness of the gate-side mounting clip 1308 may be adjusted, as compared to the source-side mounting clip 1310.

Figure 14:
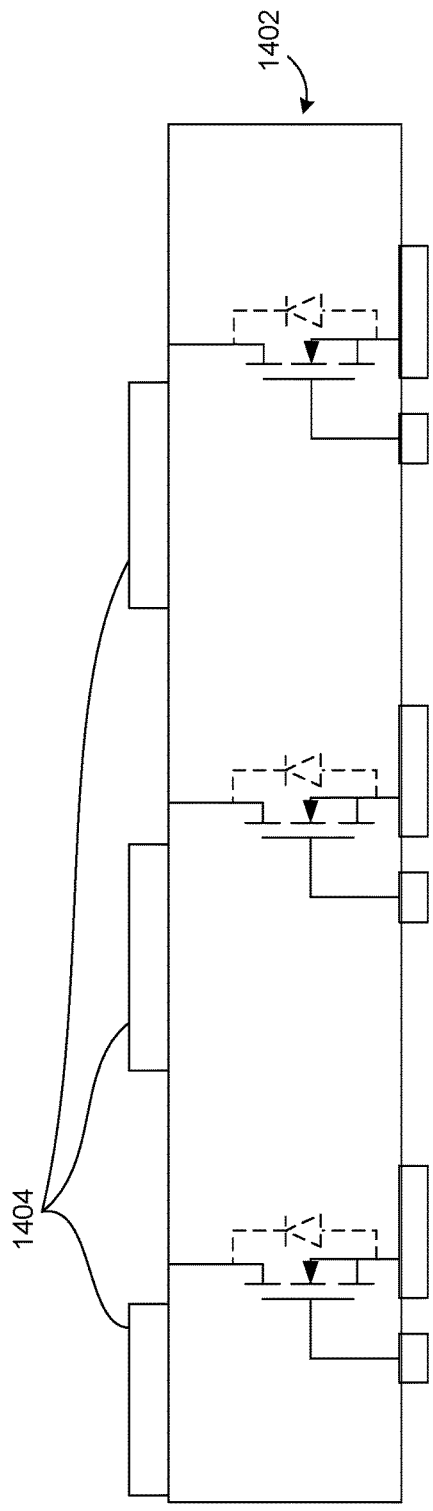
FIG. 14 illustrates a first example process step for manufacturing an implementation of the example of FIG. 13.

FIG. 14 illustrates a first example process step for forming the stacked transistor assembly of FIG. 13. In FIG. 14, similarly to FIG. 9, low-side transistors 1402 have patterned insulators 1404 formed thereon. As compared to FIG. 9, FIG. 14 does not include a blanket metal layer between the insulators 1404 and the low-side transistors 1402, but in alternate implementations of FIG. 13, such a blanket metal layer may be included.

Figure 15:
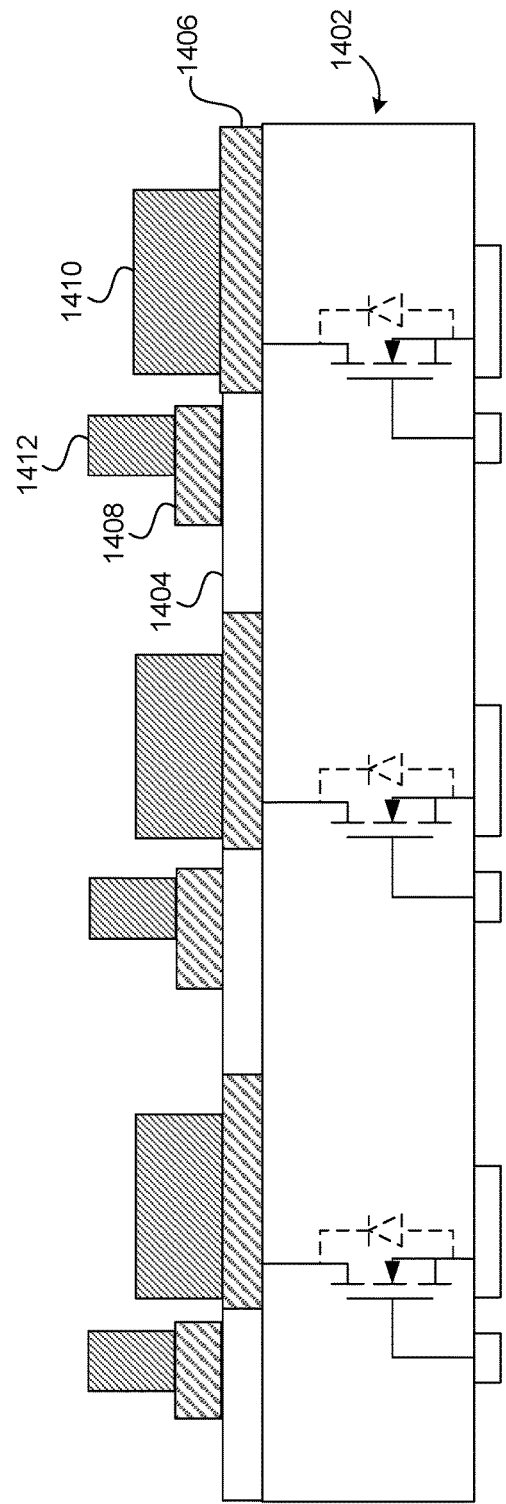
FIG. 15 illustrates a second example process step for manufacturing an implementation of the example of FIG. 13.

In FIG. 15, a metal layer is deposited over the structure of FIG. 14, thereby forming drain contacts 1406 and a mounting pad portion 1408. For example, the metal layer may include Titanium, Nickel, Silver, where the Silver provides a wetting layer for solder connections 1410, 1412. For example, the Titanium/Nickel/Silver layer 1406, 1408 may be deposited and patterned using a wet etch process, while solder 1410, 1412 may be screen printed. In other implementations, solder may instead be applied to the high-side transistor assembly.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device assembly, comprising:
 a low-side semiconductor device;
 a mounting pad covering a first portion of the low-side semiconductor device;
 a contact layer covering a second portion of the low-side semiconductor device;
 a first mounting clip electrically connected to the contact layer by a connecting portion thereof, the first mounting clip having a supporting portion joining the connecting portion of the first mounting clip to a first lead frame portion;
a second mounting clip attached to the mounting pad by a connecting portion thereof, the second mounting clip having a supporting portion joining the connecting portion of the second mounting clip to a second lead frame portion;
a high-side semiconductor device having a first terminal electrically connected to the first mounting clip and thereby to the contact layer, and having a second terminal electrically connected to the second mounting clip,
wherein the mounting pad includes an insulating layer and a connecting layer that connects the insulating layer to the high-side semiconductor device.

2. The semiconductor device assembly of claim 1, wherein attachment of the contact layer to the first mounting clip, and attachment of the mounting pad to the second mounting clip, maintains a spatial gap between the first mounting clip and the second mounting clip.

3. The semiconductor device assembly of claim 1, further comprising a metal layer formed over a surface of the low-side semiconductor device and disposed between the low-side semiconductor device and each of the contact layer and the mounting pad.

4. The semiconductor device assembly of claim 1, wherein the mounting pad has a vertical height higher than a vertical height of the contact layer, and top surfaces of the first mounting clip and the second mounting clip are substantially planar in a horizontal direction.

5. A semiconductor device assembly, comprising:
a low-side semiconductor device;
a mounting pad covering a first portion of the low-side semiconductor device;
a contact layer covering a second portion of the low-side semiconductor device;
a first mounting clip electrically connected to the contact layer by a connecting portion thereof, the first mounting clip having a supporting portion joining the connecting portion of the first mounting clip to a first lead frame portion;
a second mounting clip attached to the mounting pad by a connecting portion thereof, the second mounting clip having a supporting portion joining the connecting portion of the second mounting clip to a second lead frame portion;
a high-side semiconductor device having a first terminal electrically connected to the first mounting clip and thereby to the contact layer, and having a second terminal electrically connected to the second mounting clip,
wherein the low-side semiconductor device is a low-side, face-down transistor, and the high-side semiconductor device is a high-side, face-down transistor, and
wherein the contact layer provides a connection to a drain of the low-side, face-down transistor, and the first mounting clip is connected between the drain of the low-side, face-down transistor and a source contact of the high-side, face-down transistor.

6. The semiconductor device assembly of claim 5, wherein the second mounting clip is attached to a gate contact of the high-side, face-down transistor.

7. The semiconductor device assembly of claim 5, further comprising a third mounting clip having a connecting portion electrically connected to a drain of the high-side, face-down transistor, and a supporting portion connected to a third lead frame.

8. A stacked transistor assembly, comprising:
a low-side transistor having a low-side source contact, a low-side gate contact, and a low-side drain contact;
a high-side transistor mounted above the low-side transistor and having a high-side source contact, a high-side gate contact, and a high-side drain contact;
a mounting pad covering a first portion of the low-side transistor;
a gate mounting clip secured to the mounting pad and to the high-side gate contact;
a contact layer covering a second portion of the low-side transistor and providing the low-side drain contact; and
a source mounting clip electrically connected to the contact layer and to the high-side source contact,
wherein the mounting pad maintains the gate mounting clip in electrical isolation from the source mounting clip and the low-side drain contact.

9. The stacked transistor assembly of claim 8, wherein the mounting pad includes:
an insulating layer; and
a solder layer connecting the insulating layer to the high-side gate contact.

10. The stacked transistor assembly of claim 8, wherein the gate mounting clip has a connecting portion attached to the mounting pad and to the high-side gate contact, and a supporting portion attached to a lead frame.

11. The stacked transistor assembly of claim 8, wherein the source mounting clip has a connecting portion attached to the contact layer and to the high-side source contact, and a supporting portion attached to a lead frame.

12. The stacked transistor assembly of claim 8, further comprising:
a drain mounting clip having a connecting portion connected to the high-side drain contact and a supporting portion connected to a lead frame.

13. The stacked transistor assembly of claim 8, wherein the low-side source contact and the low-side gate contact are connected to at least one lead frame.

14. A method of making a semiconductor device assembly, comprising:
forming a low-side device assembly, including a mounting pad covering a first portion of the low-side device assembly and a contact layer covering a second portion of the low-side device assembly;
forming a high-side device assembly, the high-side device assembly having a first terminal and a second terminal;
placing the low-side device assembly on a lead frame;
attaching a first mounting clip between the lead frame and the mounting pad, including connecting a connecting portion of the first mounting clip to the mounting pad, and connecting a supporting portion of the first mounting clip to the lead frame;
attaching a second mounting clip between the lead frame and the contact layer; and
placing the high-side device assembly with the first terminal connected to the first mounting clip and the second terminal connected to the second mounting clip.

15. The method of claim 14, wherein forming the low-side device assembly comprises:
forming a metal layer that includes Copper (Cu) on a low-side device;
forming an insulator layer on the metal layer, the insulator layer including an oxide;

performing a plate-through-oxide electroplating of the contact layer onto the metal layer and adjacent to the insulator layer.

16. A method of making a semiconductor device assembly, comprising:
    forming a low-side device assembly, including a mounting pad covering a first portion of the low-side device assembly and a contact layer covering a second portion of the low-side device assembly;
    forming a high-side device assembly, the high-side device assembly having a first terminal and a second terminal;
    placing the low-side device assembly on a lead frame;
    attaching a first mounting clip between the lead frame and the mounting pad;
    attaching a second mounting clip between the lead frame and the contact layer; and
    placing the high-side device assembly with the first terminal connected to the first mounting clip and the second terminal connected to the second mounting clip, wherein attaching the second mounting clip
    includes connecting a connecting portion of the second mounting clip to the contact layer, and connecting a supporting portion of the second mounting clip to the lead frame.

17. The method of claim 16, wherein attaching the first mounting clip between the lead frame and the mounting pad includes connecting a connecting portion of the first mounting clip to the mounting pad, and connecting a supporting portion of the first mounting clip to the lead frame.

* * * * *